United States Patent
Boman et al.

(10) Patent No.: US 10,180,708 B2
(45) Date of Patent: Jan. 15, 2019

(54) CURVED CIRCUIT BOARD

(71) Applicant: Microsoft Technology Licensing, LLC, Redmond, WA (US)

(72) Inventors: Kenneth Charles Boman, Duvall, WA (US); Kanth Kurumaddali, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/163,386

(22) Filed: May 24, 2016

(65) Prior Publication Data

US 2017/0344082 A1 Nov. 30, 2017

(51) Int. Cl.
*G06F 1/20* (2006.01)
*H05K 1/02* (2006.01)

(52) U.S. Cl.
CPC ............ *G06F 1/20* (2013.01); *H05K 1/021* (2013.01); *H05K 1/0272* (2013.01); *H05K 1/0278* (2013.01); *H05K 2201/064* (2013.01); *H05K 2201/09018* (2013.01)

(58) Field of Classification Search
CPC ........ G06F 1/20; H05K 1/028; H05K 5/0069; H05K 5/0217; H01L 2224/48091; H01L 23/4985
USPC .................. 361/749, 748, 760; 257/724, 40; 174/250, 254, 257
See application file for complete search history.

(56) References Cited

U.S. PATENT DOCUMENTS

| | | | |
|---|---|---|---|
| 3,330,695 A * | 7/1967 | Curran | H05K 1/05 427/102 |
| 4,495,546 A * | 1/1985 | Nakamura | H01L 23/5387 257/E23.177 |
| 4,560,844 A * | 12/1985 | Takamura | H01H 13/84 200/293 |
| 4,845,731 A | 7/1989 | Vidmar et al. | |
| 5,031,198 A * | 7/1991 | Deucher | A61B 6/035 378/15 |
| 5,886,874 A * | 3/1999 | Onoda | H05K 1/144 235/487 |
| 6,477,224 B1 * | 11/2002 | Gallein | G01T 1/17 378/19 |
| 6,826,039 B2 | 11/2004 | Chen | |
| 7,564,685 B2 | 7/2009 | Clidaras et al. | |

(Continued)

FOREIGN PATENT DOCUMENTS

CN 202385447 U 8/2012
CN 203012620 U 6/2013

(Continued)

OTHER PUBLICATIONS

Nishi, et al., "Transient Heat Transfer of the Microprocessor System Investigation Regarding Natural Convection with Slate Style Chassis", In Transactions of the Japan Institute of Electronics Packaging, vol. 6, Issue 1, Dec. 2013, pp. 70-77.

*Primary Examiner* — Mandeep S Buttar

(74) *Attorney, Agent, or Firm* — Ray Quinney & Nebeker P.C.; Paul N. Taylor

(57) ABSTRACT

A curved printed circuit board (PCB) of a computing device is described herein. The computing device includes a housing and a PCB positioned in or on the housing. The computing device also includes a plurality of connectors physically connecting the PCB to a surface of the housing or another surface, such that at least a portion of the PCB is bent.

19 Claims, 5 Drawing Sheets

(56) References Cited

U.S. PATENT DOCUMENTS

| | | | |
|---|---|---|---|
| 7,762,373 B2* | 7/2010 | Bolton | F04D 29/665 |
| | | | 181/202 |
| 8,098,489 B2 | 1/2012 | Makley et al. | |
| 8,208,251 B2 | 6/2012 | Tan | |
| 8,351,205 B2 | 1/2013 | Tang et al. | |
| 8,493,747 B2* | 7/2013 | Naganuma | H05K 3/4691 |
| | | | 174/254 |
| 2006/0119760 A1* | 6/2006 | Okuda | G02F 1/13452 |
| | | | 349/58 |
| 2008/0179079 A1* | 7/2008 | Ishii | H05K 1/028 |
| | | | 174/254 |
| 2009/0190303 A1 | 7/2009 | Chu et al. | |
| 2013/0170127 A1 | 7/2013 | Ho | |
| 2013/0314875 A1* | 11/2013 | Jarvis | G06F 1/20 |
| | | | 361/712 |

FOREIGN PATENT DOCUMENTS

| | | |
|---|---|---|
| CN | 204463014 U | 7/2015 |
| CN | 204576407 U | 8/2015 |
| TW | 498191 B | 8/2002 |
| TW | M1246940 Y | 10/2004 |
| TW | M1350721 Y | 2/2009 |
| TW | 201210455 A | 3/2012 |

* cited by examiner

CURVED CIRCUIT BOARD

BRIEF DESCRIPTION OF THE DRAWINGS

For a more complete understanding of the disclosure, reference is made to the following detailed description and accompanying drawing figures, in which like reference numerals may be used to identify like elements in the figures.

Figure 1:
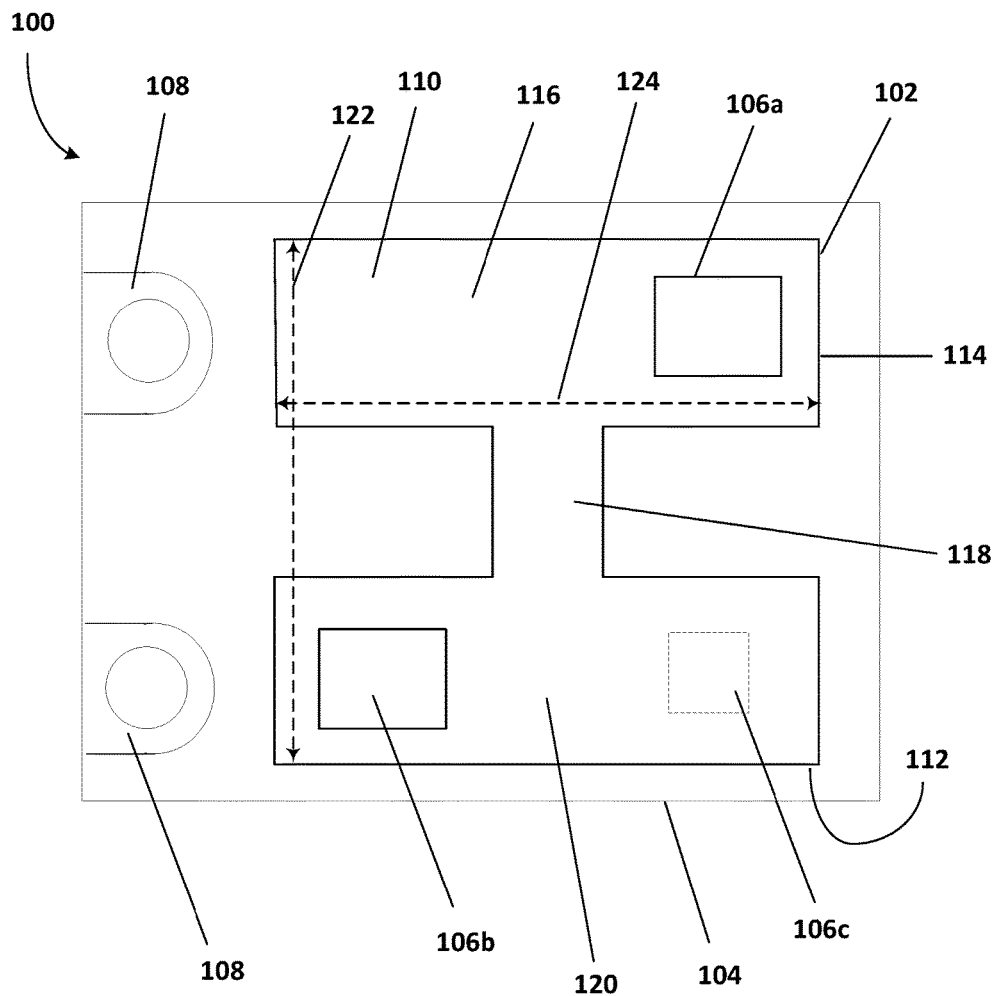
FIG. 1 depicts a top view of a computing device including an example of a curved circuit board.

While the disclosed devices, systems, and methods are representative of embodiments in various forms, specific embodiments are illustrated in the drawings (and are hereafter described), with the understanding that the disclosure is intended to be illustrative, and is not intended to limit the claim scope to the specific embodiments described and illustrated herein

DETAILED DESCRIPTION

Current microprocessor design trends include designs having an increase in power, a decrease in size, and an increase in speed. This results in higher power in a smaller, faster microprocessor. Another trend is towards lightweight and compact electronic devices. As microprocessors become lighter, smaller, and more powerful, the microprocessors also generate more heat in a smaller space, making thermal management a greater concern than before.

The purpose of thermal management is to maintain the temperature of a device within a moderate range. During operation, electronic devices dissipate power as heat that is to be removed from the device. Otherwise, the electronic device will get hotter and hotter until the electronic device is unable to perform efficiently. When overheating, electronic devices run slowly and dissipate power poorly. This can lead to eventual device failure and reduced service life.

As computing devices get smaller (e.g., thinner), thermal management becomes more of an issue. Heat may be dissipated from a computing device using forced and natural convection, conduction, and radiation as a way of cooling the computing device as a whole and a processor operating within the computing device. For forced convection, a computing device may include one or more fans to move air through the computing device and cool one or more heat generating components of the computing device.

A printed circuit board (PCB) (e.g., a motherboard) supports electronic components within a computing device and includes electrically conducting paths via which the electronic components may communicate. The electronic components include any number of heat generating components including, for example, one or more processors, memory, connectors, a hard drive, a power supply, a video card, and/or another electronic component. The electronic components supported by the PCB generate heat during operation and are cooled by a thermal management system of the computing device. For example, the electronic components are cooled by air moved through a housing of the computing device with one or more fans of the thermal management system.

A prior art motherboard is flat and is attached to a surface within a computing device (e.g., an internal surface of the housing) such that the motherboard remains flat when the motherboard is installed. A gap between the motherboard and the surface to which the motherboard may be attached is constant across the entire motherboard. The one or more fans of the thermal management system move air through the housing of the computing device, above and below the flat motherboard. One of the electronic components supported by the PCB, however, may generate more heat than the other electronic components supported by the PCB and may thus require greater cooling than the other electronic components supported by the PCB.

Disclosed herein are apparatuses, systems, and methods for increasing airflow for a portion of a circuit board on which a heat generating electronic component to be cooled (e.g., a heat generating electronic component that requires more cooling than other heat generating electronic components supported by the circuit board) is positioned. The circuit board is H-shaped and includes a middle portion (e.g., a second portion) that has a smaller cross-sectional area than and connects the legs (e.g., a first portion and a third portion, respectively) of the H-shaped circuit board. Connectors with different heights physically connect the first portion and the third portion, respectively, to a surface within a computing device. For example, first connectors physically connect the first portion of the circuit board to an internal surface of a housing of the computing device, and second connectors physically connect the third portion of the circuit board to the internal surface of the housing of the computing device. The first connectors have a greater height than the second connectors such that the circuit board bends towards the internal surface of the housing of the computing device from the first portion to the third portion of the circuit board. The first connectors and the second connectors may include bosses (e.g., threaded bosses) of different heights, respectively.

In the prior art, different sized air gaps are provided with two or more separate circuit boards positioned within the computing device at different heights. An air gap may be a designed spacing between components (e.g., surfaces of components) to achieve a lower pressure area to allow a designed amount of air to conduct heat away from a heat generating source (e.g., a heat generating component). The separate circuit boards and components on the separate circuit boards are in communication via flexible printed circuit (FPC) cables and/or coaxial cables. Drawbacks with the use of FPCs or coaxial cables include signal integrity, the additional physical space required, and increased cost. The curved circuit board of the present examples removes these FPCs and coaxial cables and the corresponding drawbacks from the computing device.

By bending the circuit board, the heat generating electronic component that requires the most cooling on the circuit board, for example, may be better cooled compared to a configuration in which the circuit board is unbent and an air gap between the circuit board and the internal surface of the housing of the computing device is constant across the circuit board, or there is not air gap between the circuit board and the internal surface of the housing. The heat generating electronic component that requires the most cooling may be positioned on the third portion of the curved circuit board of the present examples (e.g., the portion of the circuit board having the smallest air gap between the circuit board and the internal surface of the housing to which the circuit board is attached; the portion of the circuit board having the largest air gap between the circuit board and a surface that faces the heat generating component to be cooled). In one example, the circuit board is physically attached to an internal surface of the housing, such there are first, second, and third air gaps above the first portion, the second portion, and the third portion of the circuit board, respective. Due to the larger air gap above the third portion of the circuit board (i.e., the third air gap) compared to the first portion of the circuit board (i.e., the first air gap), the one or more fans move more air through the third air gap compared to the first air gap. The heat generating electronic component that requires the most cooling is thus better cooled compared to an uncurved circuit board with a uniform air gap under and/or above the circuit board.

Thermal cooling performance may be controlled by controlling airflow across the circuit board and through a gap between the circuit board and another surface (e.g., of an object or the internal surface of the housing). By bending the circuit board in particular locations, gains in air gap between the circuit board and the other surface may be provided. This may improve thermal performance for particular heat generating electronic components based on the bending. Depending on the application (e.g., the location and number of fans), the larger air gap and thus the greater amount of air being moved across the circuit board may be provided in different locations with the bending of the circuit board.

As an example, a computing device includes a housing, a PCB positioned in or on the housing, and a plurality of connectors physically connecting the PCB to a surface of the housing or another surface, such that at least a portion of the PCB is bent.

Such curved circuit boards have several potential end-uses or applications, including any electronic device having an active cooling component (e.g., fan). For example, the curved circuit board may be incorporated into personal computers, server computers, tablet or other handheld computing devices, laptop or mobile computers, gaming devices, communications devices such as mobile phones, multiprocessor systems, microprocessor-based systems, set top boxes, programmable consumer electronics, network PCs, minicomputers, mainframe computers, or audio and/or video media players. In certain examples, the curved circuit board may be incorporated within a wearable electronic device, where the device may be worn on or attached to a person's body or clothing. The wearable device may be attached to a person's shirt or jacket; worn on a person's wrist, ankle, waist, or head; or worn over their eyes or ears. Such wearable devices may include a watch, heart-rate monitor, activity tracker, or head-mounted display.

Using one or more of these features described in greater detail below, improved heat dissipation may be provided for the electronic device. With the improved heat dissipation feature, a more powerful microprocessor may be installed for the electronic device, a thinner electronic device may be designed, a higher processing speed may be provided, the electronic device may be operated at a higher power for a longer period of time, or any combination thereof may be provided when compared to a similar electronic device without one or more of the improved heat dissipation features. In other words, the heat dissipation features described herein may provide improved thermal management for an electronic device such as a mobile phone, tablet computer, laptop computer, or smart-glasses headset.

FIG. 1 shows a top view of a computing device 100 including an example of a curved circuit board 102 (e.g., a curved motherboard). The computing device 100 may be any number of computing devices including, for example, a personal computer, a server computer, a tablet or other handheld computing device, a laptop or mobile computer, a communications device such as a mobile phone, a multi-processor system, a microprocessor-based system, a set top box, a programmable consumer electronic device, a network PC, a minicomputer, a mainframe computer, an audio and/or video media player, or a wearable device such as a smart-glasses headset.

The computing device 100 includes a housing 104 that supports at least the curved motherboard 102, one or more heat generating components 106, and one or more fans 108. The one or more heat generating components 106 may be any number of electrically powered devices including, for example, a processor, memory, a power supply, a graphics card, a hard drive, or another electrically powered device. The one or more heat generating components 106 may be supported by the housing 104 via, for example, the curved motherboard 102, which is attached to and/or supported by the housing 104. The one or more heat generating components 106 are in communication with each other and/or other electrical devices or components (e.g., fans 108) of the computing device 100 via the curved motherboard 102, for example. The computing device 100 may include a number of components not shown in FIG. 1 (e.g., a hard drive, a power supply, connectors).

Three heat generating components 106 (e.g., first heat generating component 106a, second heat generating component 106b, and third heat generating component 106c) are shown in the example of FIG. 1. More or fewer heat generating components 106 may be included in the computing device 100. In one example, the heat generating component 106a is a processor, the heat generating component 106b is a graphics card, and the heat generating component 106c is a memory. In other examples, one or more of the heat generating components 106a, 106b, and 106c represent different components within the computing device 100 (e.g., a hard drive, a power supply, or another processor). The processor 106a may, for example, be the heat generating component that requires the most cooling. In other words, the processor 106a is the component of the computing device 100 that generates the most heat.

The computing device 100 shown in the example of FIG. 1 includes fans 108 to actively cool the heat generating components 106, respectively, moving heat out of the computing device 100 via vents in the housing 104 of the computing device 100. The fans 108 may be any number of different types of fans including, for example, an axial-flow fan, a centrifugal fan, a crossflow fan, or another type of fan. The fans 108 may be sized and may rotate at a speed based on the heat generating component(s) 106 to be cooled (e.g., based on the heat generated by the heat generating component(s) 106 to be cooled). Each of the fans 108 may be the same type of fan, or different types of fans may be used. The computing device 100 may include more or fewer fans 108. The fans 108 move air past at least the first heat generating component 106a, the second heat generating component 106b, and the third heat generating component 106c.

The curved motherboard 102 includes a first side 110, a second side 112, and at least one third side 114 extending from the first side 110 to the second side 112. In the example shown in FIG. 1, the first heat generating component 106a and the second heat generating component 106b are physically supported by and electrically connected to the first side 110 of the motherboard 102, and the third heat generating component 106c is physically supported by and electrically connected to the second side 112 of the motherboard 102. The first heat generating component 106*a*, the second heat generating component 106*b*, and the third heat generating component 106*c* may be supported by the motherboard 102 in other configurations. In one example, one or more of the first heat generating component 106*a*, the second heat generating component 106*b*, and the third heat generating component 106*c* are supported within the motherboard 102.

The curved motherboard 102 includes at least one layer of electrically non-conductive material and at least one layer of electrically conductive material. For example, the curved motherboard 102 includes an electrically non-conductive substrate made of any number of materials including, for example, a dielectric composite material (e.g., FR-4, Teflon, ceramic, or polyimide), and features (e.g., tracts and pads) etched from a layer of electrically conductive material (e.g., copper) disposed (e.g., laminated) on the electrically non-conductive substrate. The curved motherboard 102 may be single sided with, for example, a single layer of copper at the first side 110 or the second side 112, double sided with, for example, two layers of copper at the first side 110 and the second side 112, respectively, or multi-layered (e.g., ten layers) with outer and inner layers of, for example, copper. The inner layers of a multi-layered printed circuit board (PCB) are separated by layers of electrically non-conductive material (e.g., layers of the substrate). Features on different layers within the multi-layered PCB are electrically connected with vias.

In one example, the curved motherboard 102 includes a first portion 116, a second portion 118, and a third portion 120. In the example shown in FIG. 1, the curved motherboard 102 is H-shaped, and the first portion 116 and the third portion 120, respectively, make up the legs of the "H". The second portion 118 of the curved motherboard 102 extends between and connects the first portion 116 and the third portion 120. Each of the first portion 116, the second portion 118, and the third portion 120 has a respective length in a first direction 122, a width in a second direction 124, and a thickness in a third direction (into or out of the page). The first direction 122, the second direction 124, and the third direction are perpendicular to each other.

The first portion 116, the second portion 118, and the third portion 120 of the curved motherboard 102 may be rectangular in shape and may be any number of sizes. The first portion 116 and the third portion 120 have greater lengths in the first direction 122 than the second portion 118. The first portion 116 and the third portion 120 may have a same length or different lengths in the first direction 122. The first portion 116, the second portion 118, and the third portion 120 of the curved motherboard 102 may have a same thickness in the third direction. In one example, the first portion 116 and the third portion 120 of the curved motherboard 102 have a greater thickness in the third direction than the second portion 118 of the motherboard 102. Other sizes and/or shapes may be provided.

Figure 2:
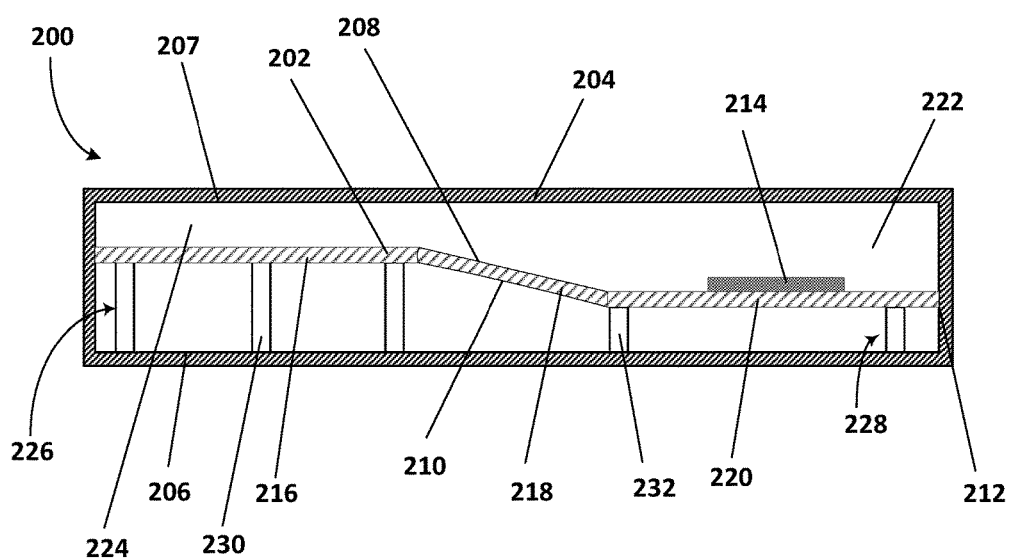
FIG. 2 depicts a cross section of a computing device including an example of a curved circuit board.

The second portion 118 of the motherboard 102 having a smaller cross-sectional area (e.g., being narrower in the second direction 124) than the first portion 116 and the third portion 120 facilitates bending of the motherboard 102. The motherboard 102 may be flat before installation in the computing device 100 but curved when installed in the computing device 100. FIG. 2 shows a cross section of a computing device 200 including an example of a curved circuit board 202 (e.g., a curved motherboard) installed in the computing device 200.

The computing device 200 includes a housing 204 in which the curved motherboard 202 is supported. The housing 204 may include a display housing and a chassis. A first inner surface 206 of the housing 204 may, for example, be formed by one of an outer surface of the display housing and an inner surface of the chassis, and a second inner surface 207 of the housing 204 may, for example, be formed by the other of the outer surface of the display housing and the inner surface of the chassis. The housing 204 may be made of any number of materials including, for example, plastic and/or a metal (e.g., titanium or aluminum).

The curved motherboard 202 includes a first side 208, a second side 210, and at least one third side 212 extending from the first side 208 to the second side 210. The curved motherboard 202 has a rectangular cross-section in an uncurved state, but differently shaped circuit boards may be provided.

The first side 208 and/or the second side 210 of the curved motherboard 202 supports one or more heat generating electronic components 214 (e.g., a processor), respectively. While the example of FIG. 2 shows only one heat generating electronic component 214 supported by the first side 208 of the curved motherboard 202, the computing device 200 may include additional components supported by the first side 208, the second side 210, and/or the third side 212 of the curved motherboard 202. For example, the computing device 200 may include another processor, memory, a power supply, a graphics card, a hard drive, connectors, additional PCBs, and/or other electrically powered devices. The computing device 200 may also include one or more fans (see FIG. 1) to move (e.g., push and/or pull) air across the first side 208 of the curved motherboard 202 and/or the second side 210 of the curved motherboard 202.

The processor 214, for example, may be a component of the computing device 200 that generates the most heat. The processor 214 generating the most heat of all components within the computing device 200 provides that the processor 214 also requires the greatest cooling. The one or more fans move air through the housing 204 of the computing device 200 (e.g., into and/or out of the page of FIG. 2) and out openings (e.g., vents) in the housing 204. The air moving through the housing 204 cools the curved motherboard 202 and components supported by the curved motherboard 202 (e.g., the processor 214) via forced convection. For example, air moving over the curved motherboard 202 adjacent to the first side 208 of the curved motherboard 202 convectively cools the processor 214 and/or a heat sink in thermal communication with the processor 214.

In the example shown in FIG. 2, the majority of forced convective cooling occurs above the curved motherboard 202 (e.g., at the first side 208 of the curved motherboard 202). In other examples, airflow may be directed with bending of the motherboard 202 to different sides of the curved motherboard 202 depending on what airflow (e.g., location of airflow) provides the most effective cooling. In yet another example, ducting may be provided and/or a separation between the second side 210 of the curved motherboard 202 and the first inner surface 206 may be blocked to force airflow over the first side 208 of the curved motherboard 202.

The curved motherboard 202 includes a first portion 216, a second portion 218, and a third portion 220. The processor 214 is supported by the third portion 220 of the curved motherboard 202. As described with reference to FIG. 1, the second portion 218 has a smaller cross sectional area than the first portion 216 and the third portion 220 (e.g., narrower in a direction into/out of the page). In order to increase an amount of air that passes through an air gap 222 between the first side 208 of the third portion 220 of the curved motherboard 202 and the second inner surface 207 of the housing 204, for example, compared to through an air gap 224 between the first side 208 of the first portion 216 of the curved motherboard 202 and the second inner surface 207 of the housing 204, the motherboard 202 is physically attached to the housing 204 or another surface within the housing 204 such that the motherboard 202 is curved. The larger air gap 222 corresponding to the third portion 220 of the curved motherboard 202 compared to the air gap 224 corresponding to the first portion 216 of the curved motherboard 202 provides less resistance to airflow, so more air flows through the air gap 222 compared to the air gap 224.

The smaller cross-sectional area of the second portion 218 of the curved motherboard 202 facilitates bending of the motherboard 202. In another example, the first portion 216, the second portion 218, and the third portion 220 of the curved motherboard 202 have a same width (e.g., in the direction into or out of the page), but the second portion 218 of the motherboard 202 has a lesser thickness than the first portion 216 and the third portion 220 of the motherboard 202, respectively. In yet another example, a curved motherboard includes more than three portions and more than one thinner portion. Such a motherboard may be bent multiple times to provide more than two different planes in which heat generating electronic components reside.

The second portion 218 may not support any components due to the strain on any components physically connected to the second portion 218 caused by the bending. In other words, all of the components supported by and electrically connected to the curved motherboard 202 are supported by the first portion 216 and/or the third portion 220 of the curved motherboard 202.

The motherboard 202 may be a flat motherboard when not installed in the computing device 200 (e.g., when uninstalled), for example, but may be bent and fixed in a bent position with a plurality of connectors. For example, at least one first connector 226 physically attaches the first portion 216 of the curved motherboard 202 to the first inner surface 206 of the housing 204, and at least one second connector 228 physically attaches the third portion 220 of the curved motherboard 202 to the first inner surface 206 of the housing 204. The example in FIG. 2 shows three first connectors 226 and two second connectors 228, but more or fewer connectors may be provided along the length of the first portion 216 and the third portion 220, respectively, and/or along the width of the first portion 216 and the third portion 220, respectively. In one example, one or more third connectors physically attach the second portion 218 of the curved motherboard 202 to the first inner surface 206 of the housing 204. In another example, the first portion 216 and the third portion 220 are physically attached to different surfaces in or on the housing 204, respectively.

The first connectors 226 include first bosses 230, and the second connectors 228 include second bosses 232. The first bosses 230 and/or the second bosses 232 may be projections that extend away from the first inner surface 206 and/or the second inner surface 207, respectively. The first bosses 230 and/or the second bosses 232 may be configured in any number of ways including, for example, as solid projections, hollow projections, tapped projections, untapped projections, or any combination thereof. The first bosses 230 and the second bosses 232 extend away from the first inner surface 206 of the housing 204. In one example, the first bosses 230 and the second bosses 232 extend away from the first inner surface 206 of the housing 204 in a direction perpendicular to the first inner surface 206 of the housing 204. The first bosses 230 have a greater height (e.g., in a direction perpendicular to the first inner surface 206 of the housing 204) than the height of the second bosses 232. The difference in height between the first bosses 230 and the second bosses 232 may be determined by the length of the second portion 218 of the motherboard 202 in that too great of a difference in height may put the second portion 218 of the motherboard 202 under too much strain when the motherboard 202 is installed in the computing device 200. The greater the length of the second portion 218 of the motherboard the greater the difference in height between the first bosses 230 and the second bosses 232 may be. The difference in height shown in the example of FIG. 2 is for illustrative purposes only, as the bend of the curved motherboard 202 may be more gradual. The first bosses 230 and the second bosses 232 are configured such that the first portion 216 and the third portion 220, respectively, are flat when the motherboard 202 is installed in the computing device 200. Other configurations may be provided (e.g., different extension directions for the first connectors 226 and the second connectors 228, bosses physically attaching the second portion 218 of the motherboard 202 to the first inner surface 206 of the housing 204).

The first bosses 230 and the second bosses 232 may be equally spaced about the first portion 216 and the third portion 220 of the curved motherboard 202, respectively. In one example, more first bosses 230 and more second bosses 232 are positioned adjacent to the second portion 218 of the curved motherboard 202 compared to the rest of the first portion 216 and the third portion 220, respectively, to reduce strain on individual bosses adjacent to the second portion 218 (e.g., at points of bending).

The first bosses 230 and the second bosses 232 may be made of the same material as at least a portion of the housing 204 or a different material. For example, the first bosses 230 and the second bosses 232 may be made of plastic or a metal (e.g., titanium or aluminum). The first bosses 230 and the second bosses 232 may be separate parts fixed to the housing (e.g., with an adhesive or welding) or may be contiguous with at least a portion of the housing 204 (e.g., a single 3D printed part).

The second side 210 of the curved motherboard 202 may be physically attached to the first bosses 230 and the second bosses 232 in any number of ways including, for example, with an adhesive, welding, or with corresponding fasteners (e.g., screws). For example, the first bosses 230 and the second bosses 232 are threaded bosses, and screws extend through corresponding openings in the curved motherboard 202 and screw into the first bosses 230 and the second bosses 232, respectively, to physically attach the first portion 216 to the first bosses 230 and physically attached the second portion 218 to the second bosses 232. The motherboard 202 may be bent in any number of other ways. For example, first connectors 226 and the second connectors 228 may include first screws and second screws but do not include first bosses 230 and second bosses 232, respectively. The first screws have a greater height than the second screws, and the first screws and the second screws extend through corresponding openings in the motherboard 202 and screw into tapped openings in the housing 204 of the computing device 200. Other configurations may be provided.

Figure 3:
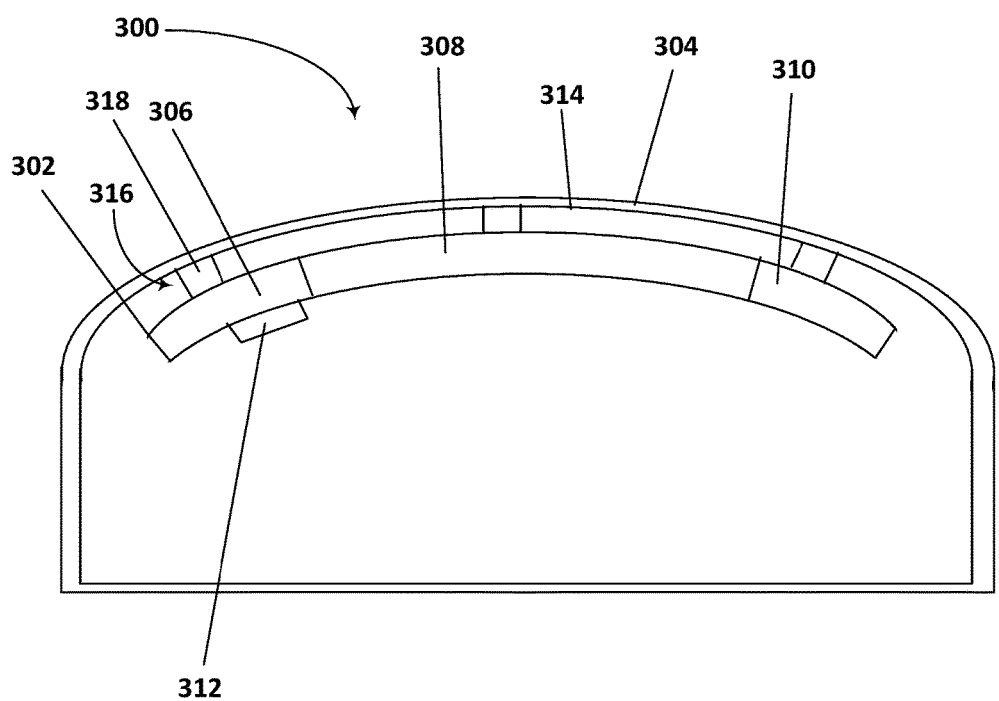
FIG. 3 depicts a top view of a computing device including another example of a curved circuit board.

FIG. 3 shows a top view of a computing device 300 including another example of a curved circuit board 302. The computing device 300 includes a housing 304, in which the circuit board 302 is supported. The circuit board 302 includes a first portion 306, a second portion 308, and a third portion 310. Similar to the circuit board of FIGS. 1 and 2, the second portion 308 of the circuit board 302 has a smaller cross-sectional area than the first portion 306 and the third portion 310 to facilitate bending of the circuit board 302. In the example shown in FIG. 3, the first portion 306 of the curved circuit board 302 supports a heat generating electronic device 312 (e.g., a processor). The curved circuit board 302 may support additional components (e.g., additional heat generating electronic devices).

The housing 304 includes a curved inner surface 314 to which the curved circuit board 302 is physically attached. The curved circuit board 302 is physically attached to the curved inner surface 314 with two or more connectors 316. The two or more connectors 316 may include bosses 318 to which the curved circuit board 302 is physically attached. In other examples, other connectors and/or more connectors may be used to physically attach the curved circuit board 302 to the curved inner surface 314.

The two or more connectors 316 have a same height such that uniform spacing between the curved circuit board 302 and the curved inner surface 314 of the housing 304 is maintained (e.g., a uniform air gap or no air gap is maintained). The uniform height of the connectors 316 provides that a curve of the bent circuit board 302 matches a curve of the curved inner surface 314 of the housing 304. Such a curved circuit board may be used in devices with curved internal/external surfaces such as a wearable device that is form fitted to a body part of a user. For example, such a curved circuit board may be used in a smart-glasses headset.

Figure 4:
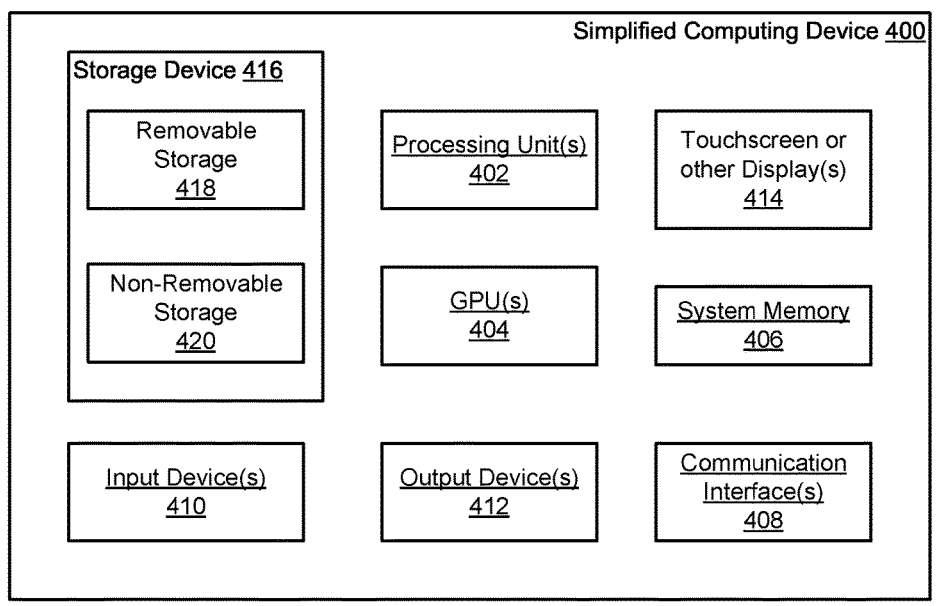
FIG. 4 is a block diagram of a computing environment in accordance with one example for implementation of the disclosed methods or one or more electronic devices.

With reference to FIG. 4, a curved circuit board, as described above, may be incorporated within an exemplary computing environment 400. The computing environment 400 may correspond with one of a wide variety of computing devices, including, but not limited to, personal computers (PCs), server computers, tablet and other handheld computing devices, laptop or mobile computers, communications devices such as mobile phones, multiprocessor systems, microprocessor-based systems, set top boxes, programmable consumer electronics, network PCs, minicomputers, mainframe computers, audio or video media players, or a wearable device such as a smart-glasses headset. The curved circuit board may be incorporated within a computing environment having an active cooling source (e.g., fans).

The computing environment 400 has sufficient computational capability and system memory to enable basic computational operations. In this example, the computing environment 400 includes one or more processing units 402, which may be individually or collectively referred to herein as a processor. The computing environment 400 may also include one or more graphics processing units (GPUs) 404. The processor 402 and/or the GPU 404 may include integrated memory and/or be in communication with system memory 406. The processor 402 and/or the GPU 404 may be a specialized microprocessor, such as a digital signal processor (DSP), a very long instruction word (VLIW) processor, or other microcontroller, or may be a general purpose central processing unit (CPU) having one or more processing cores. The processor 402, the GPU 404, the system memory 406, and/or any other components of the computing environment 400 may be packaged or otherwise integrated as a system on a chip (SoC), application-specific integrated circuit (ASIC), or other integrated circuit or system.

The computing environment 400 may also include other components, such as, for example, a communications interface 408. One or more computer input devices 410 (e.g., pointing devices, keyboards, audio input devices, video input devices, haptic input devices, or devices for receiving wired or wireless data transmissions) may be provided. The input devices 410 may include one or more touch-sensitive surfaces, such as track pads. Various output devices 412, including touchscreen or touch-sensitive display(s) 414, may also be provided. The output devices 412 may include a variety of different audio output devices, video output devices, and/or devices for transmitting wired or wireless data transmissions.

The computing environment 400 may also include a variety of computer readable media for storage of information such as computer-readable or computer-executable instructions, data structures, program modules, or other data. Computer readable media may be any available media accessible via storage devices 416 and includes both volatile and nonvolatile media, whether in removable storage 418 and/or non-removable storage 420. Computer readable media may include computer storage media and communication media. Computer storage media may include both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by the processing units of the computing environment 400.

Figure 5:
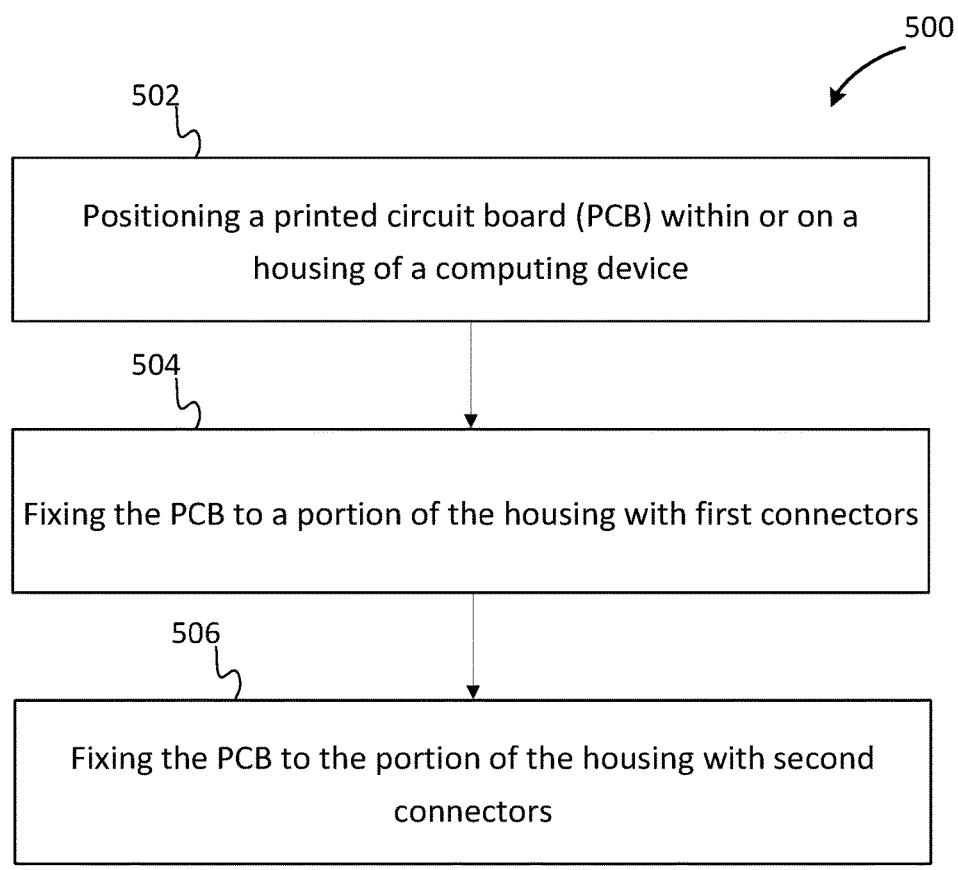
FIG. 5 is a flow diagram of a method for manufacturing a computing device in accordance with one example.

FIG. 5 shows a flowchart of one example of a method 500 for manufacturing a computing device. The computing device may be a computing device shown in FIGS. 1-4 or may be another computing device. The method 500 is implemented in the order shown, but other orders may be used. Additional, different, or fewer acts may be provided. Similar methods may be used In act 502, a PCB is positioned within or on a housing of the computing device. The PCB supports one or more heat generating electronic components to be cooled. The PCB may be H-shaped to facilitate bending and includes a first portion, a second portion, and a third portion. The second portion of the PCB extends between the first portion and the third portion of the PCB in a first direction (e.g., a length) and extends in a second direction (e.g., a width) that is perpendicular to the first direction. The second portion of the PCB extends in the second direction a lesser amount than the first portion and the third portion of the PCB, respectively. In other words, the first portion and the third portion are wider than the second portion of the PCB.

The PCB may be a single PCB that includes cutouts to form the H-shaped PCB. In one example, the PCB includes three separate PCBs that are physically attached to and in electrical communication with each other. A second PCB (e.g., corresponding to the second portion described above) may be physically attached to and in electrical communication with a first PCB (e.g., corresponding to the first portion) and a third PCB (e.g., corresponding to the third portion). The second PCB may be thinner in a third direction perpendicular to the first direction and the second direction (e.g., a thickness) to facilitate bending (e.g., may have a smaller cross-sectional area). The PCB may be a multilayer PCB with electrically conductive paths internal and/or external to the PCB. In one example, the PCB includes electrically conductive paths on only one external side of the PCB. Other shapes, sizes, and/or configurations may be provided.

The PCB may be positioned within the housing of the computing device, for example, to control heat transfer to particular heat generating components positioned on the PCB. For example, the PCB may be bent towards an inner surface of the housing to allow for more airflow above a particular portion of the PCB. In another example, the PCB may be positioned adjacent an inner surface of the housing to facilitate radiative heat transfer between a particular heat generating component and the housing. In yet another example, the PCB may be positioned adjacent a curved inner or outer surface of the housing, and the PCB may be curved to follow a curve of the housing.

In act 504, the PCB is fixed to a portion of the housing or another surface within or on the housing with first connectors. The first connectors physically attach the first portion of the PCB to the portion of the housing (e.g., an inner surface of the housing). The first connectors may include any number of types of connectors. For example, the first connectors may include first bosses extending away from the portion of the housing. The first bosses may be integral with or separate from the portion of the housing. The first bosses extend in a direction away from the portion of the housing and have a height in a direction normal to a surface of the portion of the housing.

The first bosses may be tapped or untapped bosses. With tapped first bosses, the first connectors also include corresponding fasteners (e.g., screws) that physically attach the PCB to the first bosses. For example, the fasteners extend through corresponding openings in the PCB and press and hold the PCB against the first bosses. With untapped first bosses, the PCB may be physically attached to the first bosses with, for example, an adhesive or welding.

In act 506, the PCB is fixed to the portion of the housing or the other surface with second connectors. The second connectors physically attach the third portion of the PCB to the portion of the housing (e.g., the inner surface of the housing). The second connectors may include any number of types of connectors. For example, the second connectors may include second bosses extending away from the portion of the housing. The second bosses may be integral with or separate from the portion of the housing. The second bosses extend in a direction away from the portion of the housing and have a height in a direction normal to a surface of the portion of the housing.

The second bosses may be tapped or untapped bosses. The second connectors may also include corresponding fasteners (e.g., screws) that physically attach the PCB to the second bosses. Alternatively, the third portion of the PCB may be physically attached to the second bosses with, for example, an adhesive or welding.

Other first connectors and/or second connectors may be provided. For example, the first connectors and/or the second connectors may include only fasteners, and the fasteners extend through openings in the PCB and, for example, screw into tapped openings in the housing.

The height of the first connectors is different than the height of the second connectors, such that when the first portion of the PCB and the third portion of the PCB are physically attached to, for example, the first bosses and the third bosses, respectively, the PCB (e.g., the second portion of the PCB) is bent. The bending of the PCB puts components supported by the first portion of the PCB in a different plane than components supported by the third portion of the PCB. Cooling can be controlled by the bending, as the amount of air passing above or beneath the PCB at different locations may be controlled by air gap size between the PCB and other surfaces within the housing of the computing device. The use of the first connectors and the second connectors also provides for a more rigid physical connection of the PCB to the housing or another surface within the housing of the computing device compared to prior art PCB connections.

While the present claim scope has been described with reference to specific examples, which are intended to be illustrative only and not to be limiting of the claim scope, it will be apparent to those of ordinary skill in the art that changes, additions and/or deletions may be made to the disclosed embodiments without departing from the spirit and scope of the claims.

The foregoing description is given for clearness of understanding only, and no unnecessary limitations should be understood therefrom, as modifications within the scope of the claims may be apparent to those having ordinary skill in the art.

In a first embodiment, a computing device includes a housing, a printed circuit board (PCB) positioned in or on the housing, and a plurality of connectors physically connecting the PCB to a surface within or on the housing, such that at least a portion of the PCB is bent.

In a second embodiment, with reference to the first embodiment, the plurality of connectors physically connect the PCB to an inner surface of the housing.

In a third embodiment, with reference to the first embodiment, the computing device further includes at least one fan operable to move air through an opening between the PCB and the surface within or on the housing, an opening between the PCB and another surface within or on the housing, or a combination thereof.

In a fourth embodiment, with reference to the first embodiment, a first subset of connectors of the plurality of connectors have a greater height than a second subset of connectors of the plurality of connectors such that at least a portion of the PCB is curved towards the surface within or on the housing.

In a fifth embodiment, with reference to the fourth embodiment, the PCB includes a first portion, a second portion, and a third portion. The first portion has a first cross section with a first cross-sectional area, the second portion has a second cross-section with a second cross-sectional area, and the third portion has a third cross-section with a third cross-sectional area. The first cross section, the second cross section, and the third cross section are parallel to each other. The first cross-sectional area is greater than the second cross-sectional area, and the third cross-sectional area is greater than the second cross-sectional area.

In a sixth embodiment, with reference to the fifth embodiment, at least some connectors of the second subset of connectors physically connect the third portion of the PCB to the surface within or on the housing, such that the second portion of the PCB is bent towards the surface within or on the housing from the first portion to the third portion.

In a seventh embodiment, with reference to the sixth embodiment, the computing device further includes at least one heat generating component physically connected to a surface of the first portion of the PCB. The surface of the first portion of the PCB faces away from the surface within or on the housing to which the PCB is physically connected.

In an eighth embodiment, with reference to the sixth embodiment, all components supported by the PCB are supported by the first portion of the PCB, the third portion of the PCB, or a combination thereof, respectively.

In a ninth embodiment, with reference to the first embodiment, the surface within or on the housing is curved. Each connector of the plurality of connectors has a same height.

In a tenth embodiment, with reference to the first embodiment, each connector of the plurality of connectors includes a boss and a fastener.

In an eleventh embodiment, an electronic device includes a housing including an inner surface. The electronic device also includes a circuit board positioned within the housing. The electronic device also includes a heat generating component physically connected to the circuit board, and a plurality of connectors physically connecting the circuit board to the housing. A first subset of connectors of the plurality of connectors have a greater height than a second subset of connectors of the plurality of connectors. The heights of the plurality of connectors are in a direction away from the inner surface of the housing. The circuit board includes a first portion, a second portion, and a third portion. The second portion of the circuit board extends from the first portion of the circuit board to the third portion of the circuit board. The first subset of connectors physically connects the first portion of the circuit board to the housing and the second subset of connectors physically connects the third portion of the circuit board to the housing, such that the third portion of the circuit board is closer to the inner surface of the housing than the first portion of the circuit board is to the inner surface of the housing and the second portion of the circuit board is bent.

In a twelfth embodiment, with reference to the eleventh embodiment, each connector of the plurality of connectors includes a boss extending away from the inner surface of the housing. The bosses of the first subset of connectors have a greater height than the bosses of the second subset of connectors.

In a thirteenth embodiment, with reference to the twelfth embodiment, the bosses are threaded bosses.

In a fourteenth embodiment, with reference to the eleventh embodiment, the first portion, the second portion, and the third portion of the PCB extend in a first direction and a second direction. The second direction is perpendicular to the first direction. The second portion of the PCB connects the first portion and the third portion of the PCB in the first direction. The second portion of the PCB is thinner than the first portion and the third portion of the PCB in the second direction.

In a fifteenth embodiment, with reference to the eleventh embodiment, all components supported by the circuit board are supported by the first portion of the circuit board, the third portion of the circuit board, or a combination thereof, respectively, such that the second portion of the circuit board does not support any components of the electronic device.

In a sixteenth embodiment, a circuit board includes a first portion, a second portion, and a third portion. The first portion, the second portion, and third portion have a first cross section with a first cross-sectional area, a second cross section with a second cross-sectional area, and a third cross section with a third cross-sectional area, respectively. The first cross section, the second cross section, and the third cross section are parallel to each other. The first cross-sectional area and the third cross-sectional area are greater than the second cross-sectional area, such that the second portion is bendable, placing the first portion in a different plane than the third portion when the first portion and the third portion are physically attached to a flat surface of an electronic device with a first connector and a second connector, respectively. The first connector has a greater height than the second connector. The height is in a direction perpendicular to the flat surface of the electronic device.

In a seventeenth embodiment, with reference to the sixteenth embodiment, each of the first portion, the second portion, and the third portion comprises a first side, a second side, and at least one third side extending from the first side to the second side, respectively. Each portion of the first portion, the second portion, and the third portion has a same thickness. The thickness extending from the first side to the second side in a direction perpendicular to the first side, the second side, or the first side and the second side.

In an eighteenth embodiment, with reference to the sixteenth embodiment, each of the first portion, the second portion, and the third portion comprises a first side, a second side, and at least one third side extending from the first side to the second side, respectively. The second portion has a different thickness than the first portion and the third portion, respectively. The thickness extends from the first side to the second side in a direction perpendicular to the first side, the second side, or the first side and the second side.

In a nineteenth embodiment, with reference to the sixteenth embodiment, all components supported by the circuit board are respectively positioned on the first portion or the third portion.

In a twentieth embodiment, with reference to the sixteenth embodiment, the circuit board is a motherboard.

In connection with any one of the aforementioned embodiments, the computing device or the circuit board may alternatively or additionally include any combination of one or more of the previous embodiments.

The foregoing description is given for clearness of understanding only, and no unnecessary limitations should be understood therefrom, as modifications within the scope of the claims may be apparent to those having ordinary skill in the art.

The invention claimed is:

1. A computing device comprising:

A housing having a surface, the surface being within or on the housing;

a printed circuit board (PCB) positioned in or on the housing, the PCB having a first side and a second side opposite the first side, the PCB also having a first portion, a second portion, and a third portion, the second portion extending between the first portion and the third portion;

at least one fan supported by the housing, the at least one fan operable to move air through the housing of the computing device;

a plurality of connectors physically connecting the PCB to the housing, such that at least part of the PCB is bent; and a heat generating component supported by the first side of the third portion of the PCB, the heat generating component operable to generate more heat than any other heat generating components supported by the PCB, wherein the heat generating component faces the surface of the housing, and the part of the PCB is bent such that the first portion of the PCB is closer to the surface of the housing than the third portion of the PCB is to the surface of the housing, wherein the first portion has a first cross section with a first cross-sectional area, the second portion has a second cross section with a second cross-sectional area, and the third portion has a third cross section with a third cross-sectional area, wherein the first cross section, the second cross section, and the third cross section are parallel to each other, and wherein the first cross-sectional area is greater than the second cross-sectional area, and the third cross-sectional area is greater than the second cross-sectional area, wherein the first portion, the second portion, and the third portion have a same, uniform thickness, wherein the part of the PCB is bent, such that the at least one fan is operable to move more air through a first air gap and over the heat generating component compared to a second air gap, the first air gap being between the first side of the third portion of the PCB and the surface of the housing, the second air gap being between the first side of the first portion of the PCB and the surface of the housing.

2. The computing device of claim 1, wherein the plurality of connectors physically connect the PCB to an inner surface of the housing.

3. The computing device of claim 1, wherein the at least one fan is operable to move air through an opening between the PCB and another surface within or on the housing.

4. The computing device of claim 3, wherein the heat generating component is a first heat generating component, wherein the computing device further comprises a second heat generating component, the second heat generating component being disposed on the first side of the first portion of the PCB, and wherein the part of the PCB is bent, such that the at least one fan is operable to move more air through the first air gap and over the first heat generating component compared to the second air gap and over the second heat generating component.

5. The computing device of claim 1, wherein a first subset of connectors of the plurality of connectors have a greater height than a second subset of connectors of the plurality of connectors such that at least a portion of the PCB is curved towards the surface within or on the housing.

6. The computing device of claim 5, wherein at least some connectors of the second subset of connectors physically connect the third portion of the PCB to the housing, such that the second portion of the PCB is bent away from the surface within or on the housing from the first portion to the third portion.

7. The computing device of claim 6, further comprising at least one heat generating component physically connected to the second side of the first portion of the PCB.

8. The computing device of claim 6, wherein all components supported by the PCB are supported by the first portion of the PCB, the third portion of the PCB, or a combination thereof, respectively.

9. The computing device of claim 1, wherein the surface within or on the housing is curved, and wherein each connector of the plurality of connectors has a same height.

10. The computing device of claim 1, wherein each connector of the plurality of connectors comprises a boss and a fastener.

11. An electronic device comprising:

a housing comprising an inner surface;

a circuit board positioned within the housing, the circuit board having a first side and a second side opposite the first side, the first side of the circuit board facing the inner surface of the housing, the circuit board also having a first portion, a second portion, and a third portion, the second portion extending between the first portion and the third portion;

At least one fan supported by the housing, the at least one fan operable to move air through the housing of the electronic device;

a heat generating component physically connected to the first side of the third portion of the circuit board and operable to generate more heat than any other heat generating components supported by the circuit board; and a plurality of connectors physically connecting the circuit board to the housing, a first subset of connectors of the plurality of connectors having a greater height than a second subset of connectors of the plurality of connectors, the heights of the plurality of connectors being in a direction towards the inner surface of the housing, wherein the first subset of connectors and the second subset of connectors physically connect the circuit board to the housing ing, such that the third portion of the circuit board is further away from the inner surface of the housing than the first portion of the circuit board is to the inner surface of the housing and the second portion of the circuit board is bent, wherein the first portion has a first cross section with a first cross-sectional area, the second portion has a second cross section with a second cross-sectional area, and the third portion has a third cross section with a third cross-sectional area, wherein the first cross section, the second cross section, and the third cross section are parallel to each other, and wherein the first cross-sectional area is greater than the second cross-sectional area, and the third cross-sectional area is greater than the second cross-sectional area, Wherein the first portion, the second portion, and the third portion have a same, uniform thickness, wherein the second portion of the circuit board is bent, such that the at least one fan is operable to move more air through a first air gap and over the heat generating component compared to a second air gap, the first air gap being between the first side of the third portion of the circuit board and the inner surface of the housing, the second air gap being between the first side of the first portion of the circuit board and the inner surface of the housing.

12. The electronic device of claim 11, wherein each connector of the plurality of connectors comprises a boss extending away from a portion of the housing and towards the inner surface of the housing, the bosses of the first subset of connectors having a greater height than the bosses of the second subset of connectors.

13. The electronic device of claim 12, wherein the bosses are threaded bosses.

14. The electronic device of claim 11, wherein the first portion, the second portion, and the third portion of the circuit board extend in a first direction and a second direction, the second direction being perpendicular to the first direction, wherein the second portion of the circuit board connects the first portion and the third portion of the circuit board in the first direction.

15. The electronic device of claim 11, wherein all components supported by the circuit board are supported by the first portion of the circuit board, the third portion of the circuit board, or a combination thereof, respectively, such that the second portion of the circuit board does not support any components of the electronic device.

16. A circuit board having a first side and a second side opposite the first side, the circuit board comprising:

a first portion, a second portion, and a third portion, the second portion extending between the first portion and the third portion; and a heat generating component supported by the first side of the third portion, the heat generating component operable to generate more heat than any other heat generating component supported by the circuit board, wherein the first portion, the second portion, and the third portion have a first cross section with a first cross-sectional area, a second cross section with a second cross-sectional area, and a third cross section with a third cross-sectional area, respectively, the first cross section, the second cross section, and the third cross section being parallel to each other, wherein the first cross-sectional area and the third cross-sectional area are greater than the second cross-sectional area, such that the second portion is bendable, placing the first portion in a different plane than the third portion when the first portion and the third portion are physically attached to a first surface of an electronic device with a first connector and a second connector, respectively, the first surface being a flat surface, the electronic device comprising at least one fan operable to move air through the electronic device, wherein the first connector has a greater height than the second connector, the height being in a direction perpendicular to the flat surface of the electronic device, wherein the first side of the first portion is closer to a second surface of the electronic device than the first side of the third portion is to the second surface of the electronic device when the first portion and the third portion are physically attached to the first surface of the electronic device with the first connector and the second connector, respectively, wherein the first portion, the second portion, and the third portion have a same uniform thickness, and wherein the second portion is bendable, such that the at least one fan is operable to move more air through a first air gap and over the heat generating component compared to a second air gap when the first portion and the third portion are physically attached to the first surface of the electronic device, the first air gap being between the first side of the third portion and the second surface of the electronic device, the second air gap being between the first side of the first portion and the second surface of the electronic device.

17. The circuit board of claim 16, wherein the thickness extends from the first side to the second side in a direction perpendicular to the first side, the second side, or the first side and the second side.

18. The circuit board of claim 16, wherein all components supported by the circuit board are respectively positioned on the first portion or the third portion.

19. The circuit board of claim 16, wherein the circuit board is a motherboard.

* * * * *